United States Patent
Ogawa

(10) Patent No.: US 6,276,599 B1
(45) Date of Patent: Aug. 21, 2001

(54) METHOD AND APPARATUS FOR FORMING SOLDER BUMPS

(75) Inventor: Hirotaka Ogawa, Komaki (JP)

(73) Assignee: Noda Screen Co., Ltd., Aichi (JP)

( * ) Notice: Subject to any disclaimer, the term of this patent is extended or adjusted under 35 U.S.C. 154(b) by 0 days.

(21) Appl. No.: 09/288,826

(22) Filed: Apr. 9, 1999

(30) Foreign Application Priority Data

Apr. 10, 1998 (JP) .................................. 10-099393
Mar. 29, 1999 (JP) .................................. 11-086530

(51) Int. Cl.$^7$ ............................ B23K 35/14; B23K 31/02
(52) U.S. Cl. ....................... 228/254; 228/253; 228/123.1; 228/180.22
(58) Field of Search ..................................... 228/254, 253, 228/249, 245, 122.1, 123.1, 178, 180.22, 180.21, 180.1, 179.1; 438/613

(56) References Cited

U.S. PATENT DOCUMENTS

| | | | |
|---|---|---|---|
| 5,238,176 | * | 8/1993 | Nishimura ............................ 228/256 |
| 5,261,593 | * | 11/1993 | Casson et al. ................... 228/180.22 |
| 5,788,143 | * | 8/1998 | Boyd et al. ........................... 228/253 |
| 5,834,062 | | 11/1998 | Johnson et al. . |
| 5,855,323 | * | 1/1999 | Yost et al. ............................. 228/135 |
| 5,880,017 | * | 3/1999 | Schwiebert et al. .................. 438/613 |

FOREIGN PATENT DOCUMENTS

| | | |
|---|---|---|
| 0 259 102 | 3/1988 | (EP) . |
| 565 908 A2 | 10/1993 | (EP) . |
| 565 908 A3 | 10/1993 | (EP) . |
| 10-64947 | 3/1998 | (JP) . |
| 10-65055 | 3/1998 | (JP) . |
| 10-71695 | 3/1998 | (JP) . |

OTHER PUBLICATIONS

A.C. Andreasen et al., "Solder Washer Pneumatic Applicator", IBM Technical Disclosure Bulletin, vol. 23, No. 8, Jan. 1981, pp. 3625–3627.

* cited by examiner

*Primary Examiner*—Patrick Ryan
*Assistant Examiner*—Jonathan Johnson
(74) *Attorney, Agent, or Firm*—Wenderoth, Lind & Ponack, L.L.P.

(57) ABSTRACT

A method of forming solder bumps on pads formed on a surface of a base material includes the steps of supplying solder to a template having a number of through holes formed to correspond to the pads of the base material respectively so that the through holes are filled with the solder, the template having an upper side and an underside, scraping the sides of the template with doctors to remove an excessive amount of solder, and opposing the template to the base material so that the pads are aligned with the through holes respectively, covering the side of the template opposite to the base material with a pressure housing and increasing pressure in an interior of the pressure housing so that a difference in pressure between an exterior and the interior of the pressure housing extrudes the molten solder from the template to the pad side of the base material.

5 Claims, 15 Drawing Sheets

FIG. 16
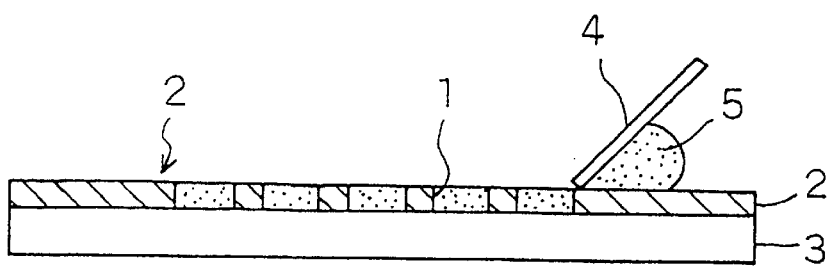
FIG.16A
PRIOR ART
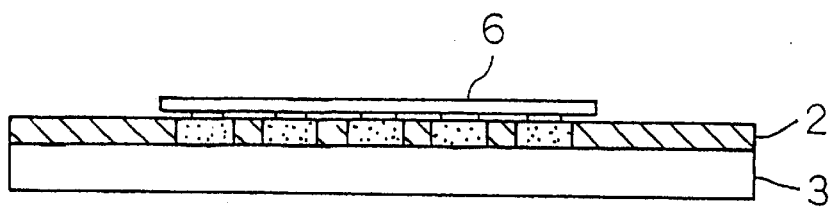
FIG.16B
PRIOR ART
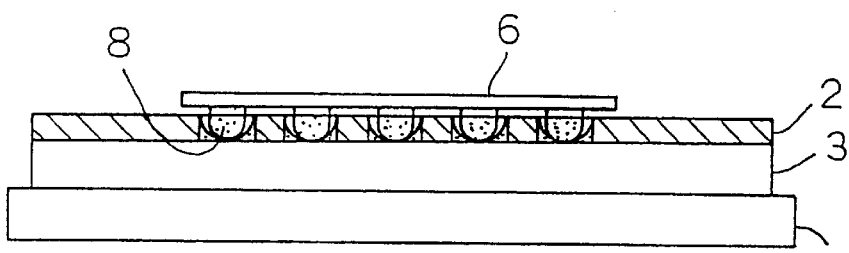
FIG.16C
PRIOR ART
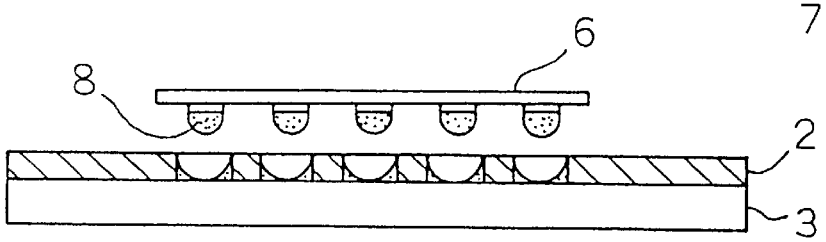
FIG.16D
PRIOR ART

METHOD AND APPARATUS FOR FORMING SOLDER BUMPS

BACKGROUND OF THE INVENTION

1. Field of the Invention

This invention relates to a method of forming solder bumps on a substrate, a semiconductor chip, etc. and an apparatus for carrying out the method.

2. Description of the Prior Art

Solder bumps are recently formed by depositing fine solder balls onto a number of metal pads formed on a semiconductor package, for example. The solder bumps are used in a mounting technique for fixing and electrically connecting the semiconductor package. Japanese unexamined patent publication No. 10-64947 (1998) discloses such a method of forming solder bumps as described above. The disclosed method will be described with reference to FIGS. 16A to 16D. A metal plate 2 formed with a number of through holes 1 is placed on a horizontal base 3. A predetermined amount of solder paste is applied to the metal plate 2 using a squeegee 4 so that the through holes 1 are filled with the solder paste. A substrate 6 on which solder bumps are to be formed is attached to the metal plate 2. The substrate 6 and the metal plate 2 are then placed on a heating plate 7 to be heated such that molten solder 8 is transferred to the substrate 6 side.

In the above-described method, however, transfer of the molten solder 8 to the substrate 6 is carried out merely using adhesion to a metal portion of the substrate 6 resulting from surface tension of the molten solder 8. Accordingly, since the molten solder 8 is not positively extruded, the transfer of the molten solder 8 lacks reliability and accordingly, the amount of molten solder 8 transferred is not constant. As a result, the size of the solder bump is not uniform.

SUMMARY OF THE INVENTION

Therefore, an object of the present invention is to provide a method of forming solder bumps on a substrate etc. which can provide a uniform the size of the solder bumps and provide a good productivity and in which the solder bumps can be formed on the pads even when the pads are formed at small pitches on the substrate etc., and an apparatus for carrying out the method.

The present invention provides a method and an apparatus for forming solder-bumps on pads formed on a surface of a base material such as a semiconductor package etc. The method comprises the steps of supplying solder to a template having a number of through holes formed to correspond to the pads of the base material respectively so that the through holes are filled with the solder, the template having an upper side and an underside, scraping the sides of the template by doctors to remove an excessive amount of solder, and opposing the template to the base material so that the pads are aligned with the through holes respectively, covering the side of the template opposite to the base material with a pressure housing and increasing pressure in an interior of the pressure housing so that a difference in pressure between an exterior and the interior of the pressure housing extrudes the molten solder from the template to the pad side of the base material.

According to the above-described method, both sides of the template are rubbed by the doctors after the through holes of the template have been filled with the solder. As a result, the excessive solder on both sides of the template is removed such that each through hole is usually filled with a proper amount of solder. In the solder transferring step, the molten solder is reliably extruded from the through holes of the template to the base material side by the pressure difference between the interior and the exterior of the pressure housing. Consequently, since an amount of molten solder transferred onto the pads of the base material becomes fixed, the size of each solder ball can be uniformed.

Either molten solder or solder paste may be used to fill the through holes in the solder filling step. In the case of molten solder, a pressure-reducing housing is applied to the upper side of the template so that a pressure-reducing chamber is defined therein, and the molten solder is sucked into the through holes by reducing pressure in the pressure-reducing chamber.

When an inert gas is supplied into the pressure housing in the solder transferring step, the solder with which the through holes are filled is melted in an atmosphere of the inert gas. Consequently, since the solder is prevented from oxidation, solder balls of high quality can be formed.

The invention also provides a solder bump forming apparatus for attaching solder bumps to pads formed in a surface of a base material. The apparatus comprises a support sheet disposed horizontally and having an opening, a template provided to close the opening of the support sheet and having a number of through holes formed to correspond to the pads of the base material respectively, the template having an upper side and an underside, means for filling the through holes of the template with solder, a pair of doctors for scraping the sides of the template to remove an excessive amount of solder having overflowed the through holes, base material support means for supporting the base material so that the template with the through holes filled with the solder is opposed to the base material so that the pads are aligned with the through holes respectively, heating means for heating the solder in a state where the base material is supported by the base material support means, and a pressure housing covering the side of the template confronting the base material, which side is opposite to the base material. The solder is extruded from the through holes of the template to the pad side of the base material by increasing pressure in an interior of the pressure housing.

BRIEF DESCRIPTION OF THE DRAWINGS

Other objects, features and advantages of the present invention will become clear upon reviewing the following description of the preferred embodiments, made with reference to the accompanying drawings, in which:

FIGS. 16A to 16D are sectional views showing a conventional solder bump forming method.

DETAILED DESCRIPTION OF THE PREFERRED EMBODIMENTS

Figure 1:
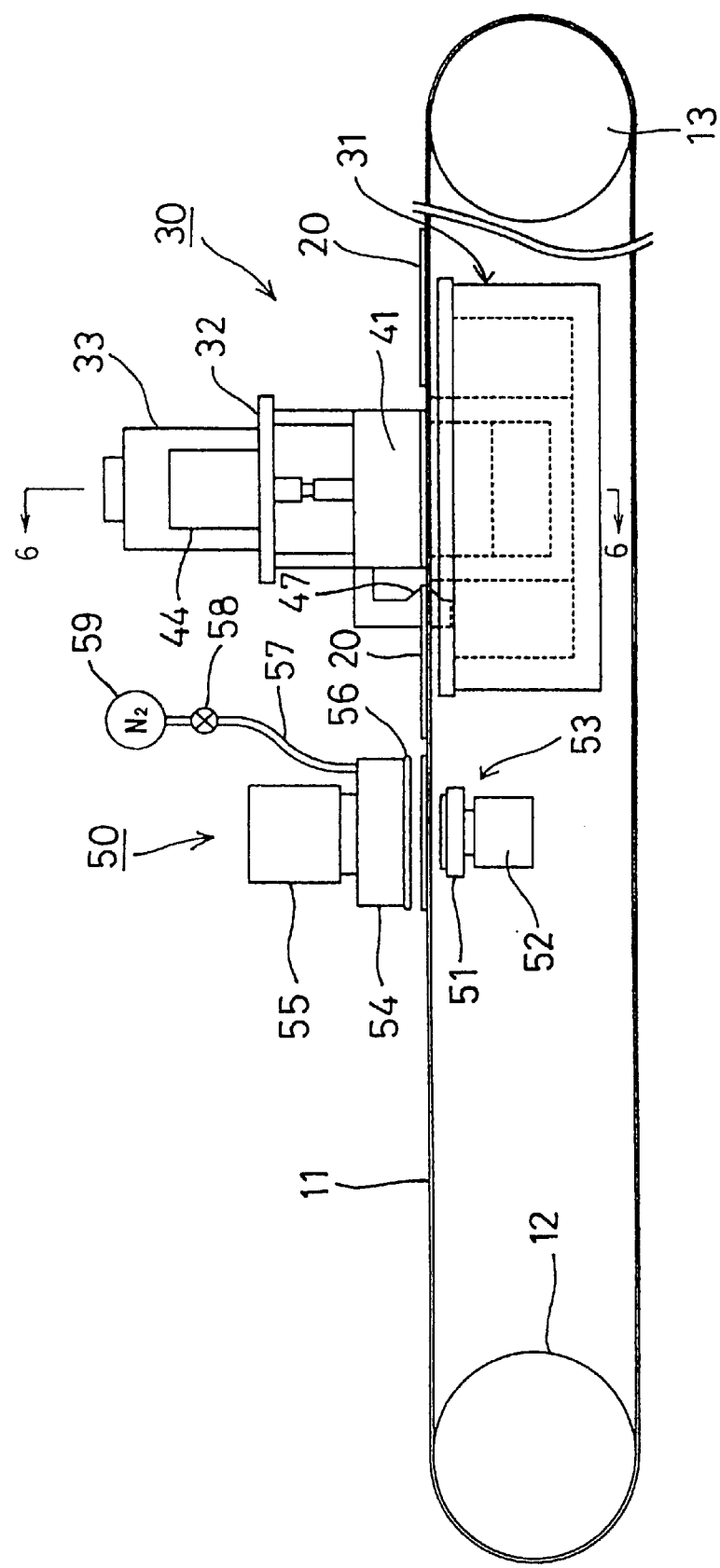
FIG. 1 is a schematic side view of a solder bump forming apparatus of one embodiment in accordance with the present invention.
Figure 2:
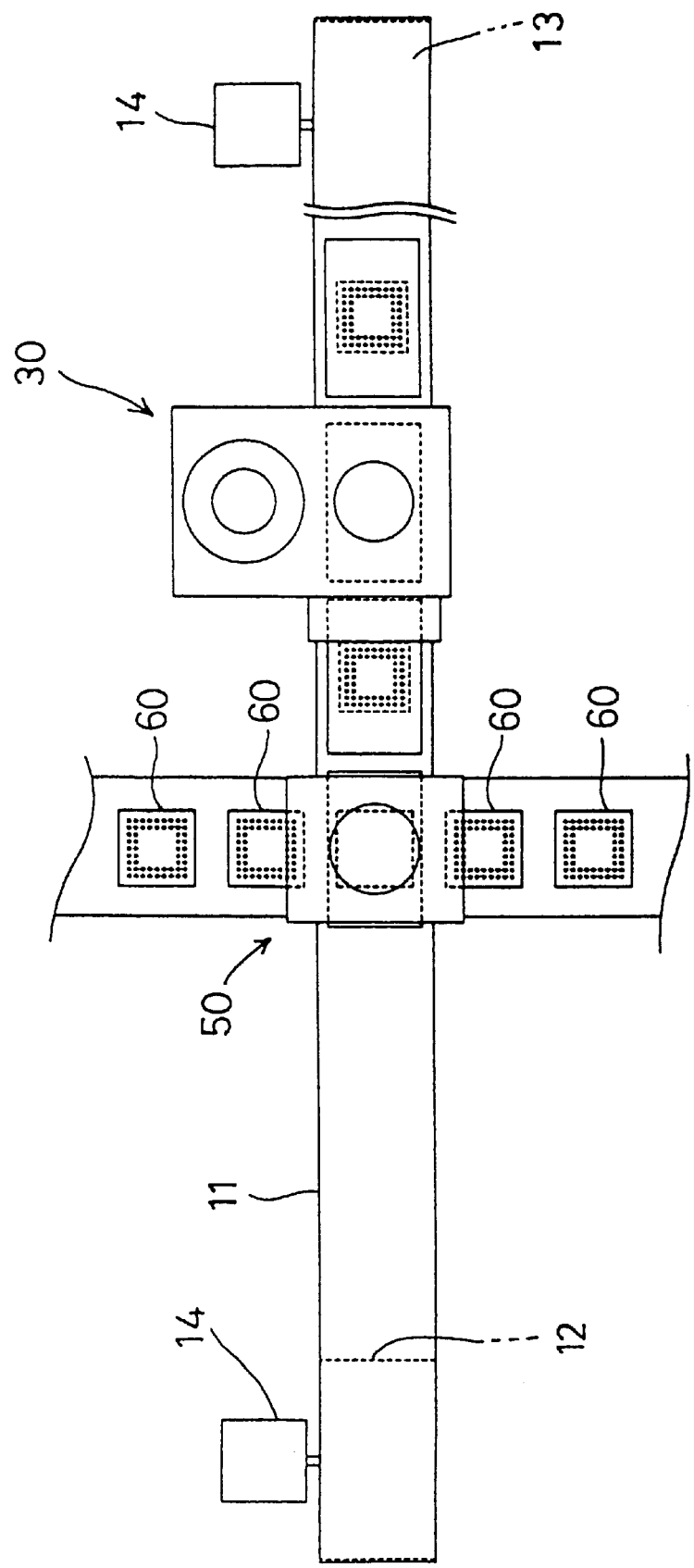
FIG. 2 is a schematic plan view of the solder bump forming apparatus.
Figure 3:
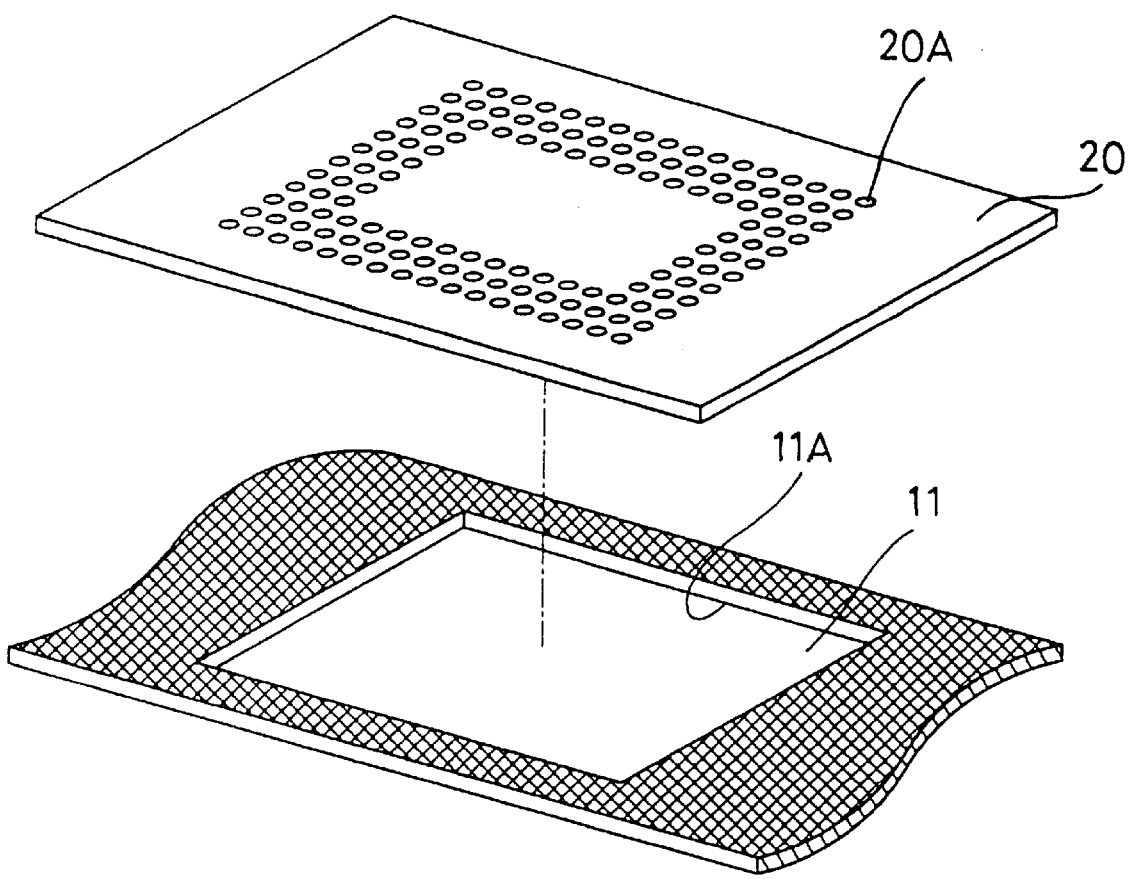
FIG. 3 is a perspective view of a support sheet and a template.
Figure 4:
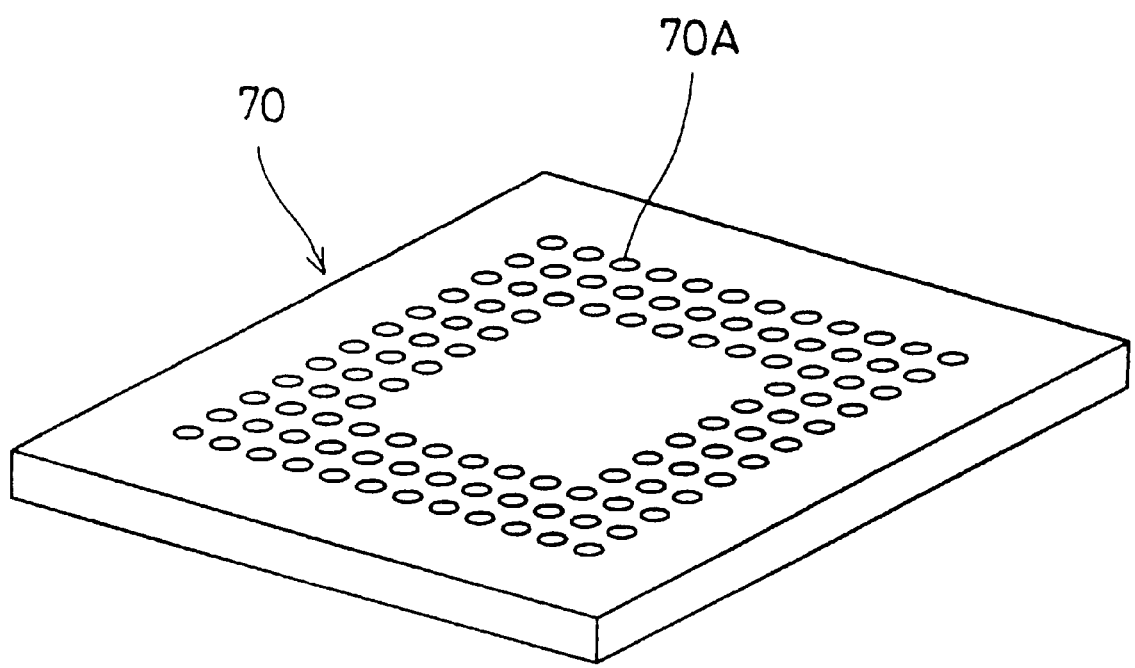
FIG. 4 is a perspective view of a semiconductor package.
Figure 5:
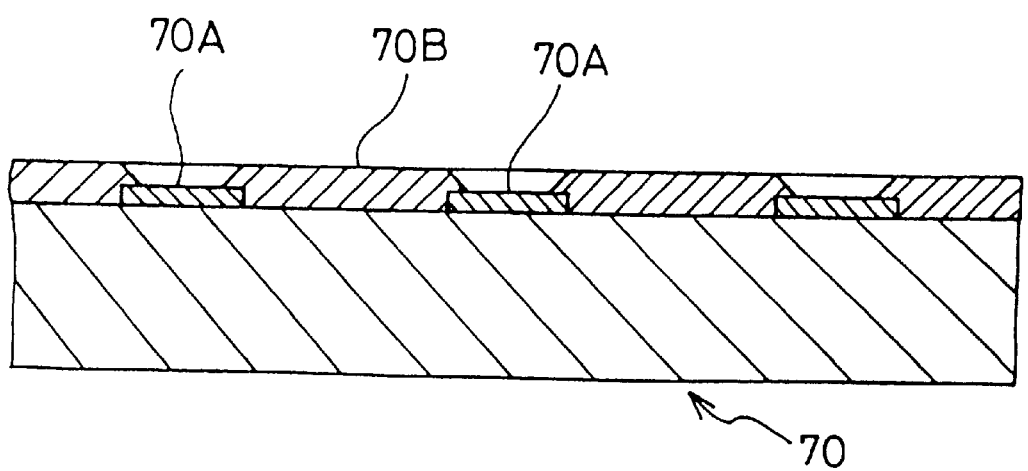
FIG. 5 is a partially enlarged sectional view of the semiconductor package.

An embodiment of the present invention will be described with reference to FIGS. 1 to 9. The invention is applied to a method of fabricating a ball grid array (BGA) in the embodiment. Referring to FIGS. 1 and 2, a solder bump forming apparatus in accordance with the invention is schematically shown. A support sheet 11 formed by connecting a fine mesh sheet made of, for example, stainless steel into the shape of an endless belt. The support sheet 11 extends between two drive rollers 12 and 13 so as to be held generally horizontally. The support sheet 11 has, for example, four rectangular openings 11A formed at predetermined positions as shown in FIG. 3. Four templates 20 are bonded to the support sheet 11 so as to close the openings 11A respectively. Each template 20 is made of a ceramic such as alumina and has a number of through holes 20A formed to correspond to electrically conductive metal pads 70A densely formed on one side of the semiconductor package 70 respectively. Accordingly, the semiconductor package 70 constitutes a base material on which solder bumps are formed. As shown in FIGS. 4 and 5, each pad 70A is made by means of copper plate and a solder resist layer 70B is formed between each pad 70A and adjacent one so as to overlap an outer periphery of each pad 70A. Each of the drive rollers 12 and 13 is driven in the normal and reverse directions by a roller drive unit 14. Accordingly, the templates 20 are moved rightward and leftward when the support sheet 11 is reciprocated rightward and leftward.

A solder filling section 30 is provided near the drive roller 13 between the rollers 12 and 13, and a solder transferring section 50 is provided on the left of the solder filling section 30 as viewed in FIG. 1. The structure of the solder filling section 30 will first be described with reference to FIGS. 6 and 7. The solder filling section 30 includes a solder reservoir 31 having a heat-insulating wall 31A. Solder is melted by an electric heater (not shown) serving as a heat source. Resultant molten solder is reserved in the solder reservoir 31. A support frame 32 is provided over the solder reservoir 31, and an electric motor 33 is mounted on the support frame 32. The motor 33 includes a rotational shaft 34 to which a drive shaft 36 is connected via a joint 35. The drive shaft 36 is rotatably mounted on a bearing 37. The drive shaft 36 has a lower end provided with a pressure blade 38 enclosed by a spiral casing 39. The spiral casing 39 has an outlet 39A communicating with a lower interior of an upwardly open spout cylinder 39B. The motor 33, the pressure blade 38 and their related components constitute a solder spouter 40. Upon drive of the motor 33, the molten solder reserved in the solder reservoir 31 is fed out into the spout cylinder 39B by the pressure blade 38 such that a surface of the molten solder in the spout cylinder 39B is raised relative to the molten solder outside the spout cylinder.

One of the templates 20 fixed to the support sheet 11 is positioned over the spout cylinder 39B so as to close the upper opening of the spout cylinder. A cylindrical pressure-reducing housing 41 having an open bottom is provided over the template 20 so as to be vertically moved by a driving mechanism (not shown). When the pressure-reducing housing 41 is lowered to closely contact the upper side of the template 20, a pressure-reducing chamber 42 is defined in the pressure-reducing housing 41. The pressure-reducing housing 41 is dimensioned so as to outwardly cover a region of the template 20 where the through holes 20A are formed. A piston 43 is provided in the pressure-reducing housing 41 so as to be vertically moved by a solenoid 44 secured to the support frame 32. The above-described construction constitutes pressure reducing means 45. When the piston 43 is ascended in a state where the pressure-reducing housing 41 is applied to the upper side of the template 20, the pressure in the pressure-reducing chamber 42 is reduced such that the molten solder in the spout cylinder 39B is sucked up into the through holes 20A of the template 20. Accordingly, the above-described construction constitutes solder filling means 46 for filling the through holes 20A of the template 20 with solder or the molten solder.

A pair of scraping doctors 47 are provided in an up-and-down disposition between the solder filling means 46 and the solder transferring section 50 so as to be positioned over the solder reservoir 31 so that the support sheet 11 is interposed therebetween. The scraping doctors 47 have their distal ends positioned so as to come into contact with both sides of the template 20 respectively and are inclined so as to depart from the template 20 as they go rearward or toward the solder transferring section 50. The scraping doctors 47 scrape or rub both sides of the template 20 with the through holes 20A filled with the solder, thereby removing an excessive amount of solder having overflowed the through holes 20A down into the solder reservoir 31.

The solder transferring section 50 will now be described. In the solder transferring section 50, a support plate 51 is horizontally disposed below the support sheet 11 so as to be vertically moved by a lift cylinder 52 as shown in FIG. 1. The semiconductor packages 70 are fed one by one onto the support plate 51 while being moved in a direction perpendicular to the support sheet 11. The fed package 70 is positioned by a positioning device (not shown) freely driving the support plate 51 along X and Y axes perpendicular to each other on a horizontal plane. In a state where the semiconductor package 70 is positioned, the pads 70A thereof are opposed to the through holes 20A of the template 20 respectively. Accordingly, the above-described construction constitutes base material supporting means 53.

Figure 8:
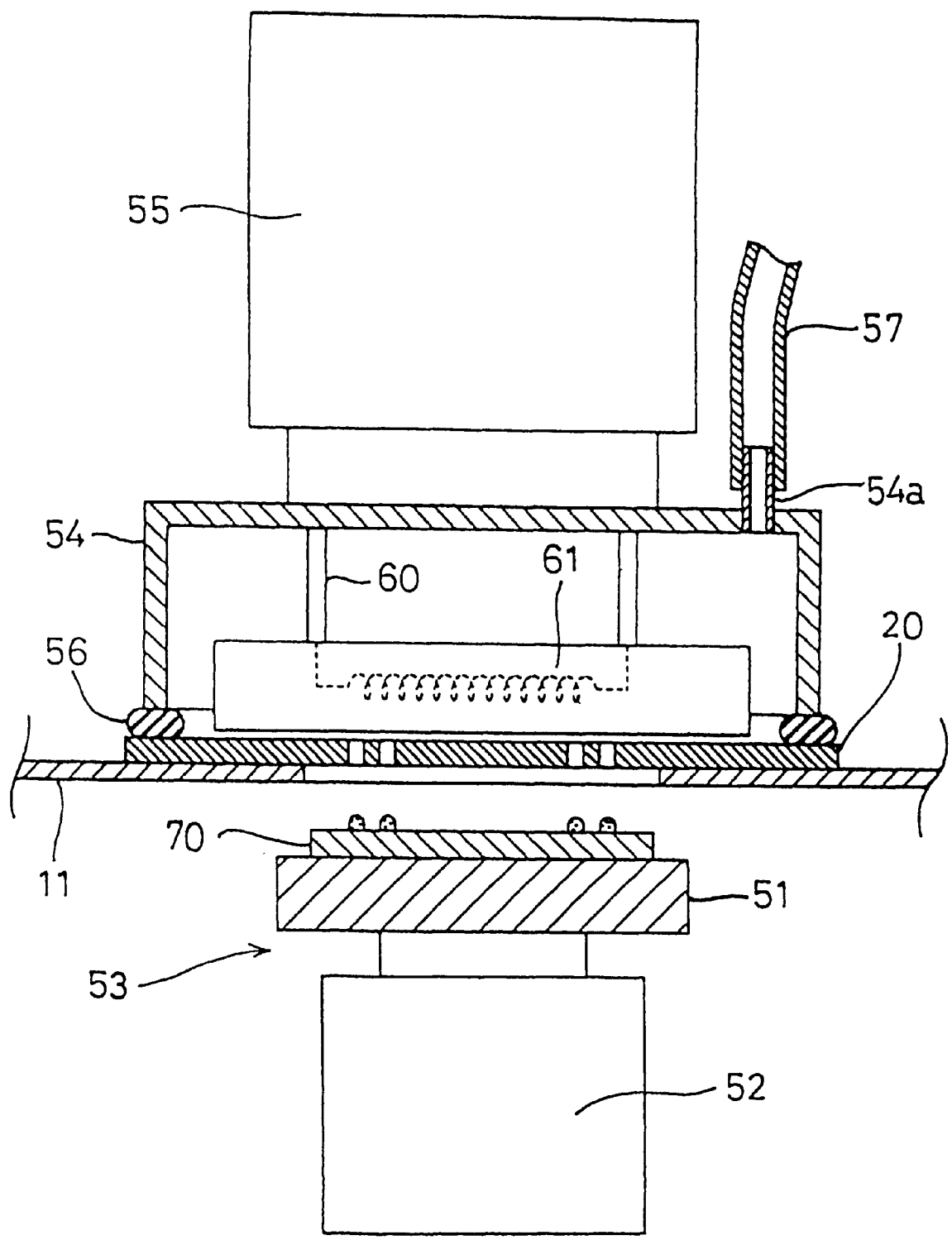
FIG. 8 is an enlarged longitudinally sectional front view of a solder transferring step.
Figure 9:
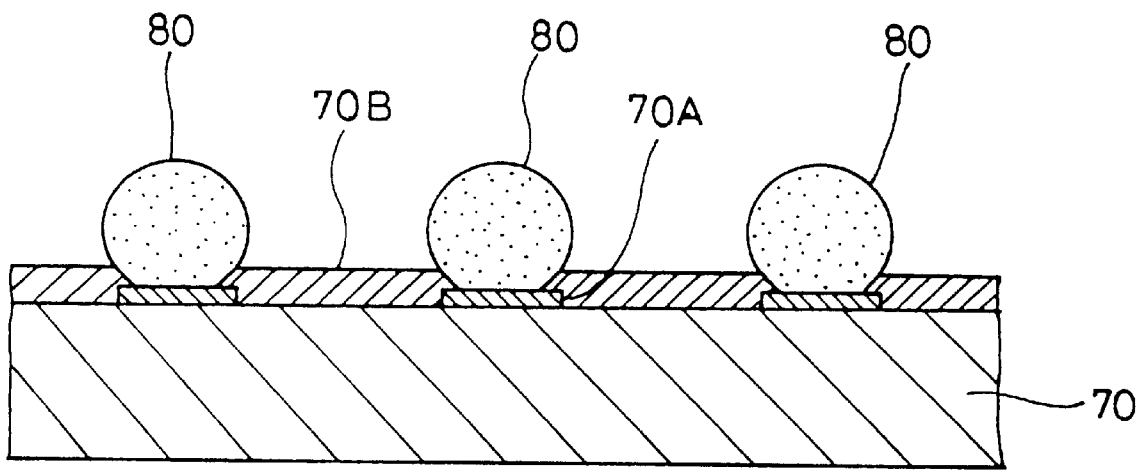
FIG. 9 is an enlarged sectional view of the semiconductor package on which solder balls are formed.

Over the support sheet 11, a pressure housing 54 is mounted on a lift cylinder 55 so as to be vertically moved. The pressure housing 54 is formed into the shape of a box having an open bottom. When descended by the lift cylinder 55, the pressure housing 54 is applied to the upper side of the template 20 to come into contact with the outer periphery of the region where the through holes 20 are formed, thereby upwardly covering the region of the through holes 20. A packing 56 is provided along an overall open lower edge of the pressure housing 54 to improve gastightness when the pressure housing 54 is in contact with the upper side of the template 20. The pressure housing 54 has an inlet 54a communicating through a connecting tube 57 and an electromagnetic valve 58 with a gas cylinder 59 filled with gaseous nitrogen serving as an inert gas, so that the interior of the pressure housing 54 is filled with the gaseous nitrogen, as shown in FIG. 8. A panel heater 61 serving as heating means is suspended on two electric supply pipes 60 as shown in FIG. 8. When the pressure housing 54 is descended by the lift cylinder 55, the panel heater 61 is adjacent and opposed to the template 20 to heat the solder filling the through holes 20A such that the solder is re-melted.

Figure 6:
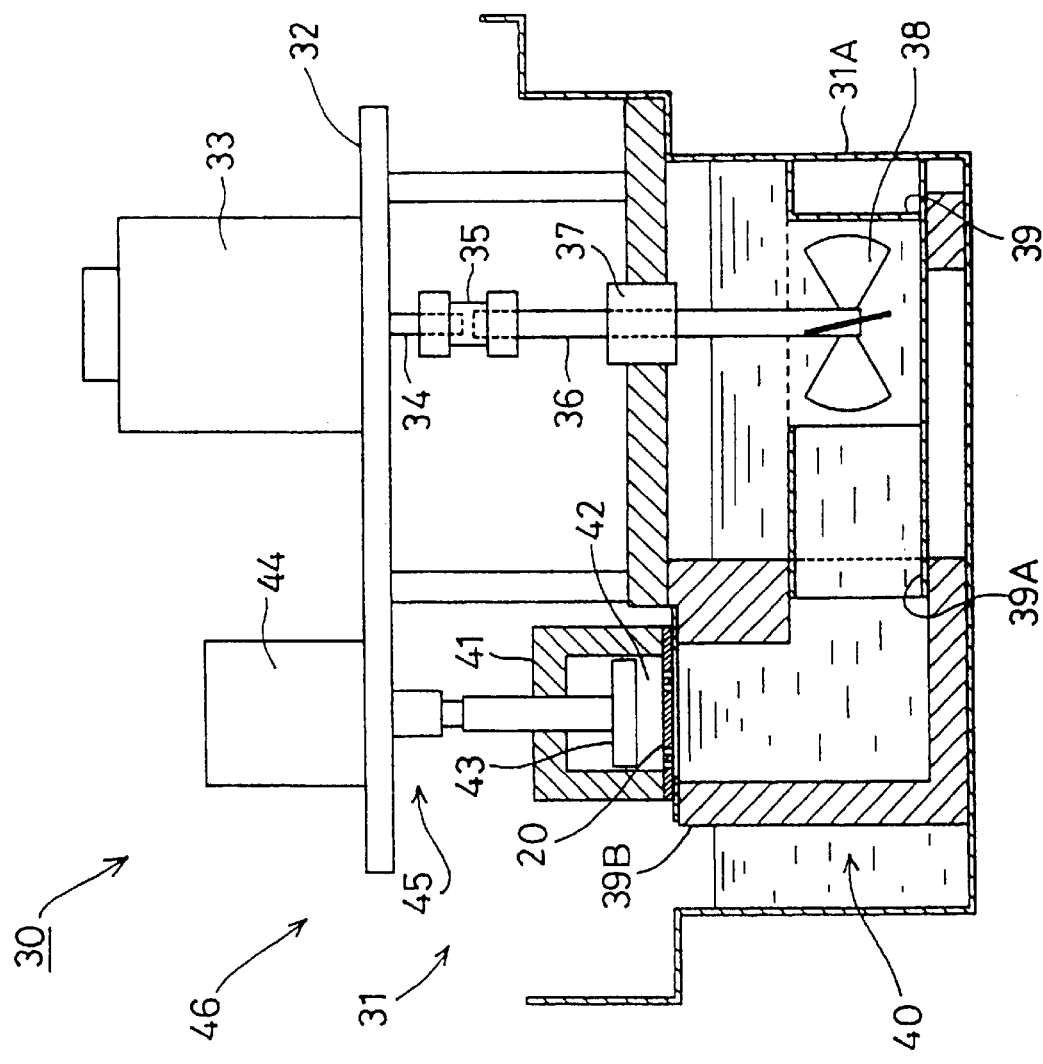
FIG. 6 is an enlarged sectional view of a through hole filling step taken along line 6—6 in FIG. 1.
Figure 7:
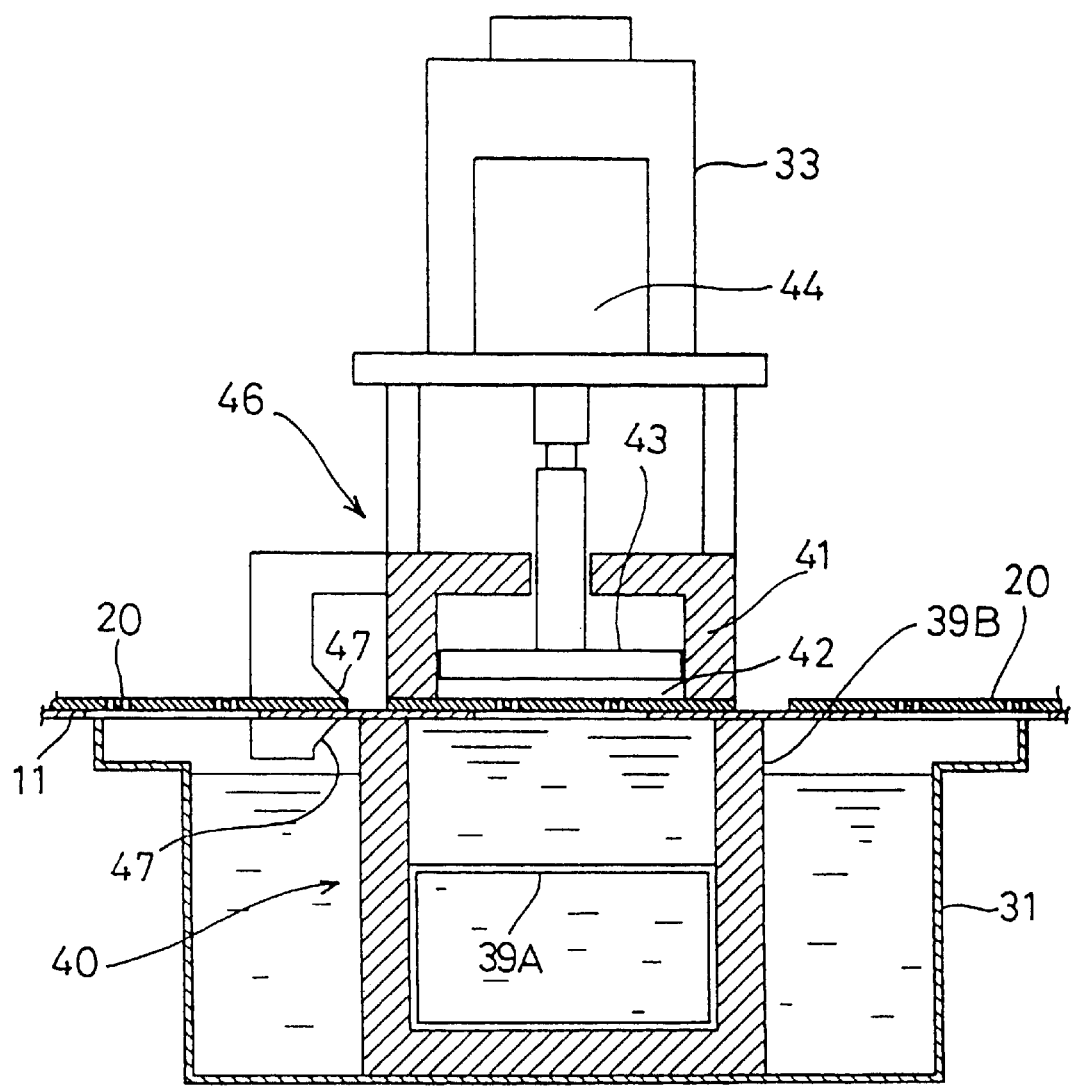
FIG. 7 is an enlarged longitudinally sectional front view of the through hole filling step.

The operation of the solder bump forming apparatus will now be described. At an initial stage, the left-hand one of the four templates 20 is located at the solder filling section. The through holes of the template 20 are filled with molten solder. For this purpose, the template 20 is positioned so as to cover the top opening of the spout cylinder 39B of the solder reservoir 31. The pressure-reducing housing 41 is then descended to be applied to the upper side of the template 20 as shown in FIGS. 6 and 7. Under this condition, the molten solder is slightly above a brim of the spout cylinder 39B such that the molten solder flows along the underside of the template 20 so as to clean or come into contact with the latter. The pressure in the pressure-reducing chamber 42 is reduced when the piston 43 is lifted upward by the solenoid 44. With this, the molten solder is sucked up into the through holes 20A of the template 20 (the solder filling step).

Thereafter, the pressure-reducing housing 41 is ascended, and the roller drive units 14 are driven so that the support sheet 11 is moved leftward as viewed in FIG. 7. As a result, the template 20 is moved relative to the scraping doctors 47 while brought into contact with both sides of the template 20. Accordingly, both sides of the template 20 are scraped by the scraping doctors 47 respectively so that an excessive amount of molten solder having overflowed the through holes at both sides of the template 20 is scraped or otherwise removed from the template, falling down into the solder reservoir 31 (an excessive solder removing step).

When reaching the solder transferring section 50, the template 20 is stopped over the support plate 51. Then, the support plate 51 is ascended by the lift cylinder 52 and positioned along the perpendicular X and Y axes on the horizontal plane by the positioning device. The semiconductor package 70 is applied to the underside of the template 20 so that the pads 70A of the package correspond to the through holes 20A of the template respectively. The pressure housing 54 is then descended to closely contact the upper side of the template 20. Simultaneously, the panel heater 61 is energized to heat up and the gaseous nitrogen is supplied into the pressure housing 54.

The solder filling the through holes 20A of the template 20 is self-cooled to be solidified in the course of movement to the solder transferring section 50. However, the template 20 is heated in a state where the upper side thereof is covered with the pressure housing, so that the solder is immediately melted to become flowable. With this, the gaseous nitrogen is supplied into the pressure housing 54 and a temperature in the pressure housing 54 is increased by the heat generated by the panel heater 61. This results in an increase in the pressure in the pressure housing 54. Consequently, a pressure difference between the exterior and the interior of the pressure housing 54 extrudes the molten solder from the through holes 20A downward or toward the semiconductor package 70. When a predetermined time has elapsed from the arrival of the template 20 at the solder transferring section 50, the lift cylinder 52 is actuated to descend the support plate 51. Consequently, the molten solder is transferred onto the pads 70A of the semiconductor package 70 (a solder transferring step; and see FIG. 8). Since the solder resist layer 70B repels the molten solder or the molten solder has no wettability with respect to the solder resist layer 70B, the molten solder is rounded into the shape of a ball by the surface tension and solidified into solder balls 80 (see FIG. 10).

When the transfer of solder is carried out at the solder transferring section 50 as described above, the through holes 20A of another template 20 is simultaneously filled with molten solder. The support sheet 11 is driven leftward so that the template 20 is moved to the solder transferring section 50 again. When all the templates 20 are moved to the solder transferring section 50 and the solder transfer is completed, the drive rollers 12 and 13 are rotated in the reverse direction so that the leftmost template 20 is returned to the solder filling section 30. Thereafter, the above-described steps are repeated continuously so that the solder balls 80 are formed on each semiconductor package 70.

According to the above-described embodiment, the pressure difference between the exterior and the interior of the pressure housing 54 is utilized to extrude the molten solder from the through holes 20A. Consequently, the solder can be transferred to the semiconductor package 70 side without remaining in the through holes 20A. In this case, the size of the solder balls 80 formed on the semiconductor package 70 depends on an amount of molten solder fed from the template 20 side. Since an amount of solder sufficient to fill up each through hole 20A is usually supplied, the diameter of each solder ball 80 can be rendered constant. Further, the molten solder supplied into the through holes 20A contains other components such as flux, each through hole 20A is filled with a constant amount of solder which amount is not adversely affected by a component ratio. Consequently, the consistency of the shape of the solder ball 80 can be improved. When required at the time of transfer to the pads 70A of the semiconductor package 70, a solder flux may previously be deposited onto the pads 70A by painting or printing.

Further, since the inert gas (gaseous nitrogen) is supplied into the pressure housing 54 in the foregoing embodiment, the solder in the through holes 20A is prevented from oxidation when re-melted. Consequently, the solder balls 80 quality can be formed with a high degree of quality.

Figure 10:
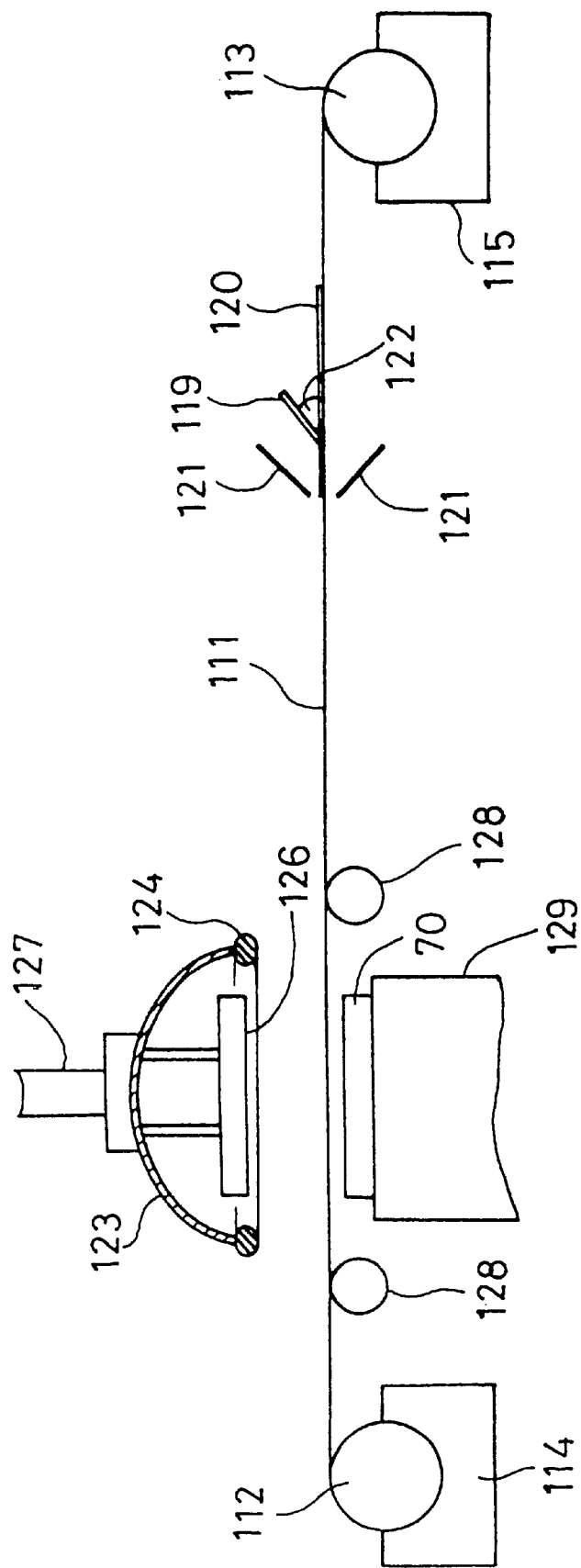
FIG. 10 is a schematic side view of a solder bump forming apparatus of another embodiment in accordance with the present invention.

FIGS. 10 to 15 illustrate another embodiment of the invention. Referring to FIG. 10, a solder bump forming apparatus of the embodiment is schematically shown. Both ends of a stainless support sheet 111 are wound on take-up rollers 112 and 113 so as to be held horizontally. Templates 120 are welded or bonded to the support sheet 111 so as to close the openings (not shown) thereof in the same manner as in the foregoing embodiment. Each template 120 is made of stainless steel and has a number of through holes 120A formed to correspond to electrically conductive metal pads 70A densely formed on one side of the semiconductor package 70 respectively (see FIGS. 3 and 4). See FIG. 11. Accordingly, the semiconductor package 70 constitutes a base material on which solder bumps are formed.

The take-up rollers 112 and 113 are driven by roller drive units 114 and 115 so that the rollers are rotated in the normal and reverse directions. When one take-up roller 112 is driven to wind up the support sheet 111, the sheet is moved leftward as viewed in FIG. 10. Thereafter, when the other take-up roller 113 is driven to wind up the support sheet 111, the sheet is moved rightward as viewed in FIG. 10. With such movement of the support sheet 111, the templates 120 fixed thereto are also moved leftward and rightward. A solder filling section and a solder transferring section are juxtaposed between both take-up rollers 112 and 113.

Figure 11:
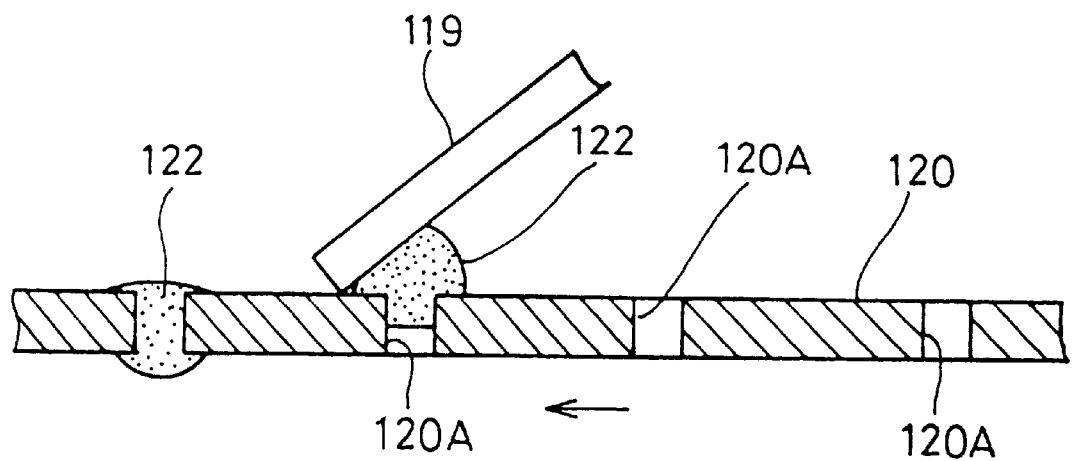
FIG. 11 is an enlarged sectional view of a template in a through hole filling step.
Figure 12:
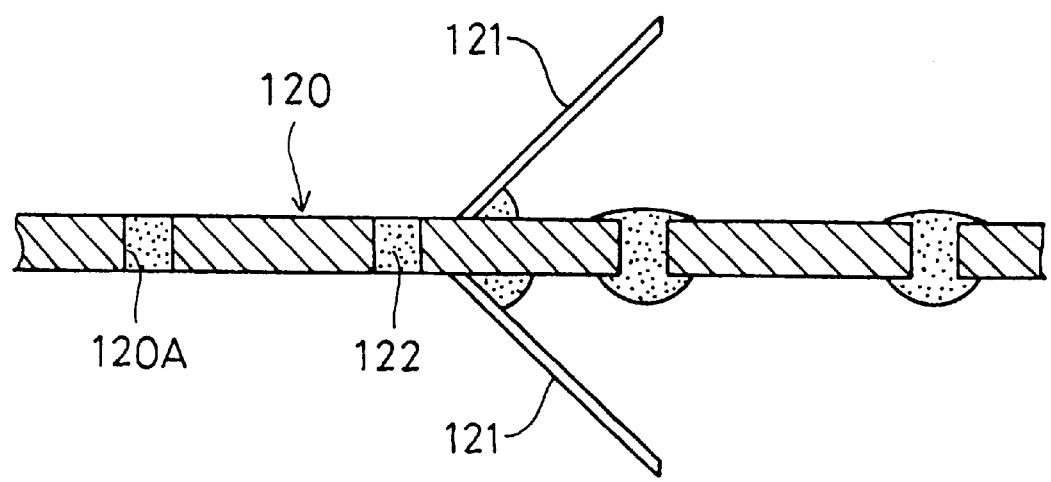
FIG. 12 is an enlarged sectional view of the template in an excessive solder removing step.

A squeegee 119 serving as solder filling means is provided at the upper side of the support sheet 111 so as to be brought into contact with the upper side of the template 120. When the template 120 is located in the solder filling section, solder paste 122 is supplied onto the template 120 from a solder supplying apparatus (not shown). Upon supply of the solder paste 122, the squeegee 119 is descended to come into contact with the template 120, and the support sheet 111 is wound up leftward so that the template 120 is moved leftward. As a result, the solder paste 122 is pushed down into the through holes 120A of the template 120 as shown in FIG. 11 (the solder filling step).

A pair of metal scraping doctors 121 are provided in an up-and-down disposition to the left of the squeegee 119. The scraping doctors 121 have their distal ends positioned so as to come into contact with the upper and lower sides of the template 120 respectively. After the through holes 120A of the template 120 have been filled with the solder paste 122 by the squeegee 119, the template 120 is held between the scraping doctors 121 while being moved leftward. Consequently, the solder paste 122 having overflowed the through holes 120A and adhering on both sides of the template 120 is scraped by the doctors 121.

Figure 13:
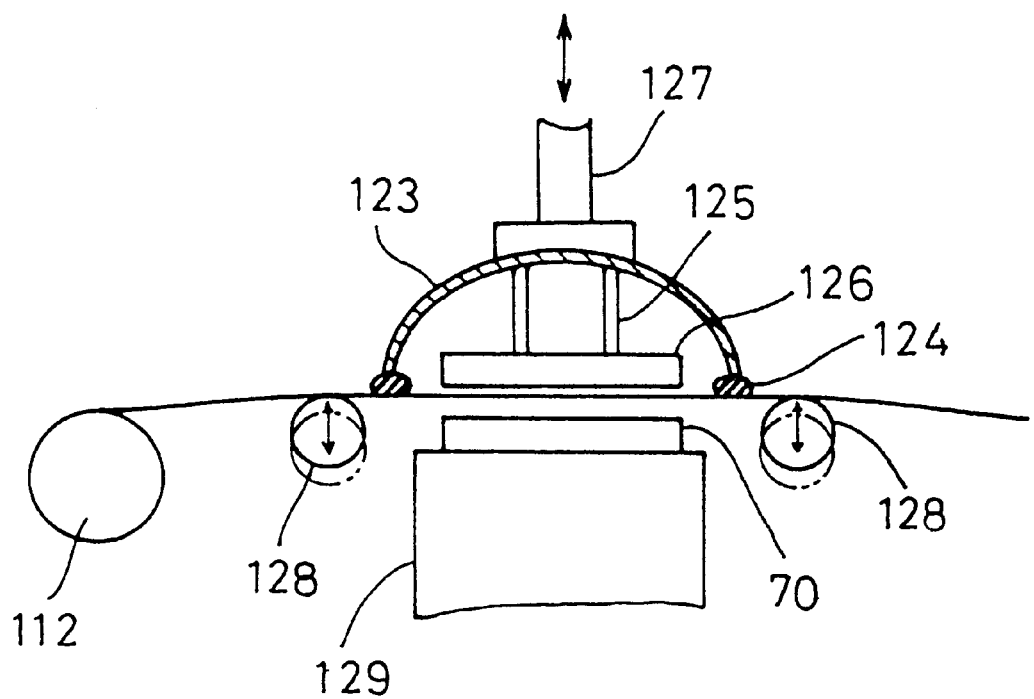
FIG. 13 a sectional view of a solder transferring step.
Figure 14:
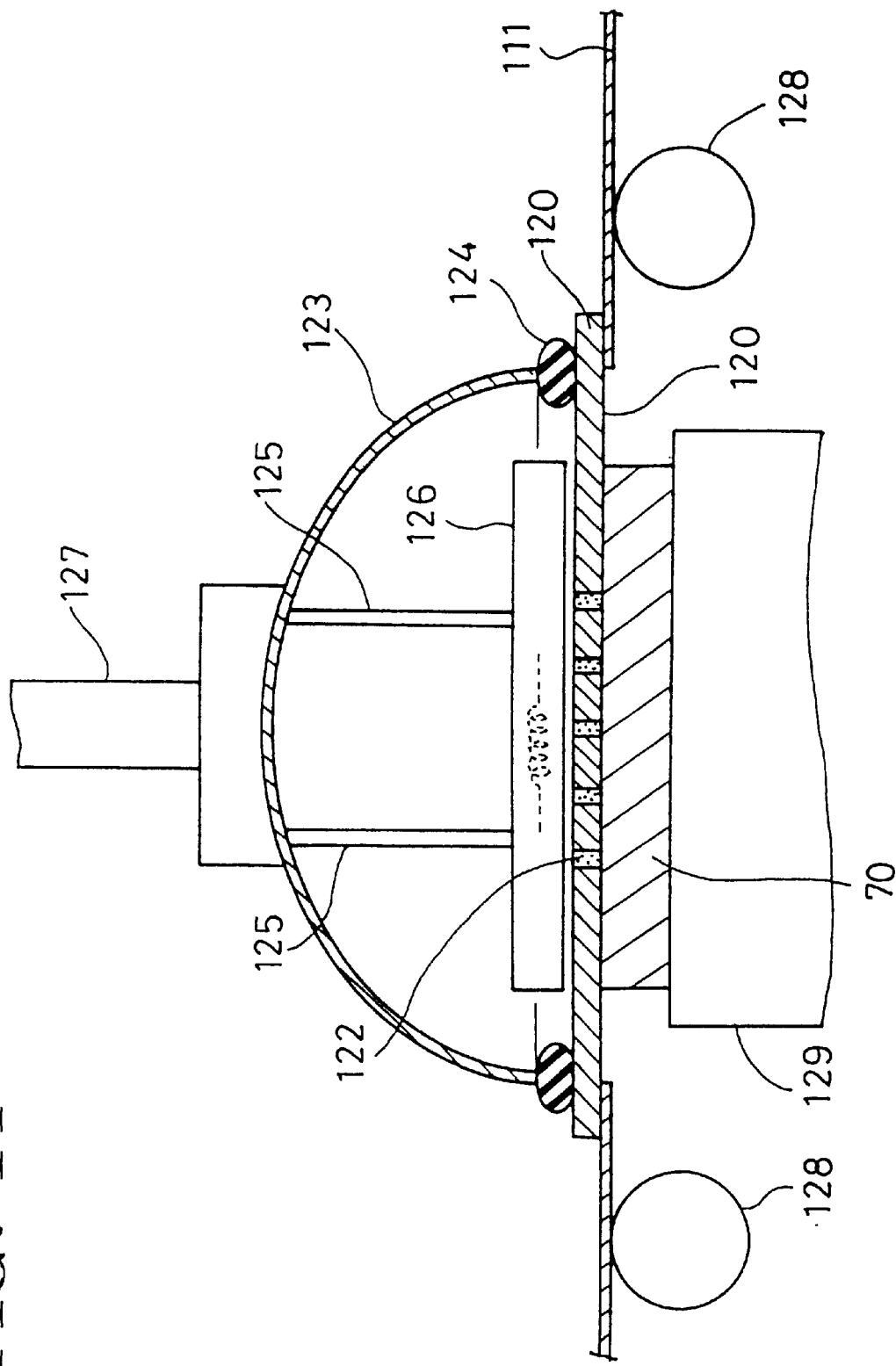
FIG. 14 is an enlarged sectional view of the solder transferring step in a state where a roller assumes a lower position.

A semispherical pressure housing 123 is provided at the solder transferring section as shown in FIG. 13. An annular resilient rubber seal is fitted with an outer circumferential edge of the pressure housing 123. In the pressure housing 123, a panel heater 126 serving as heating means is suspended on two electric supply pipes 125. The pressure housing 123 is fixed to a lower end of a support post 127 vertically moved by a lifting mechanism (not shown). When the support post 127 is descended, the pressure housing 123 is caused to adhere closely contact the template 120 so as to cover a region of the template 120 where the through holes 120A are formed. When the support post 127 is ascended, the panel heater 126 is caused to depart from the template 120.

A pair of lift rollers 128 are provided below the support sheet 111 at right-hand and left-hand sides of the solder transferring section. The lift rollers 128 are moved vertically and hold the support sheet 111 in the horizontal state. A work table 129 serving as base material supporting means is provided below the support sheet 111 at the solder transferring section. A workpiece or the semiconductor package 70 is fed onto the work table 129 so as to assume a predetermined position thereon. The roller driving units 114 and 115 are then controlled so that the template 120 is stopped at the predetermined solder transferring section and so that the through holes 120A of the template 120 correspond to the respective pads 70A of the semiconductor package 70.

The operation of the solder bump forming apparatus of the embodiment will be described. At an initial stage, the template 120 is located at the solder filling section as shown in FIG. 10. The solder paste 122 is supplied onto the template 120 from the solder supplying apparatus, and the squeegee 119 is descended to the left-hand end of the template 120, slightly pressing the template. The roller drive unit 114 is driven so that the take-up roller is rotated to wind up the support sheet 111. As a result, the support sheet 111 is moved leftward as viewed in FIG. 10. With the movement of the support sheet 111, the solder paste 122 is pushed through all the through holes 120A from the upper side to the underside of the template 120. The solder paste 122 overflows each through hole 120A at the underside thereof. Simultaneously, the template 120 is held between the pair of scraping doctors 121 located on the left of the squeegee 119. Accordingly, even if the solder paste 122 protrudes from the through holes 120A at both sides of the template 120, the solder paste 122 is scraped by the doctors 121, so that each through hole 120A is usually filled with a predetermined amount of solder paste 122.

The template 120 is successively moved leftward, reaching the solder transferring section. When having reached the solder transferring section, the template 120 is detected by position detecting means (not shown). The roller drive unit 114 is stopped on the basis of a signal delivered from the position detecting means. Simultaneously, the pressure housing 123 located over the template 120 is descended to cause its rubber seal 124 to contact or adhere to the outer periphery of the template 120, and the panel heater 126 provided in the pressure housing 123 is energized. The template 120 is subjected to heat generated by the panel heater 126 to be heated. As a result, the solder paste in the through holes 120A is melted, and air in the pressure housing 123 is expanded such that pressure difference between the exterior and the interior of the pressure housing 123 extrudes the molten solder 122 downward from the through holes 120A. The semiconductor package 70 has previously been supplied onto the work table 129 at the solder transferring section. Moreover, the semiconductor package 70 is positioned so that the pads 70A formed on the upper side of thereof correspond to the respective through holes 120A of the template 120. Accordingly, the molten solder extruded from the through hole 120A adheres onto the respective pads 70A of the semiconductor package 70.

Figure 15:
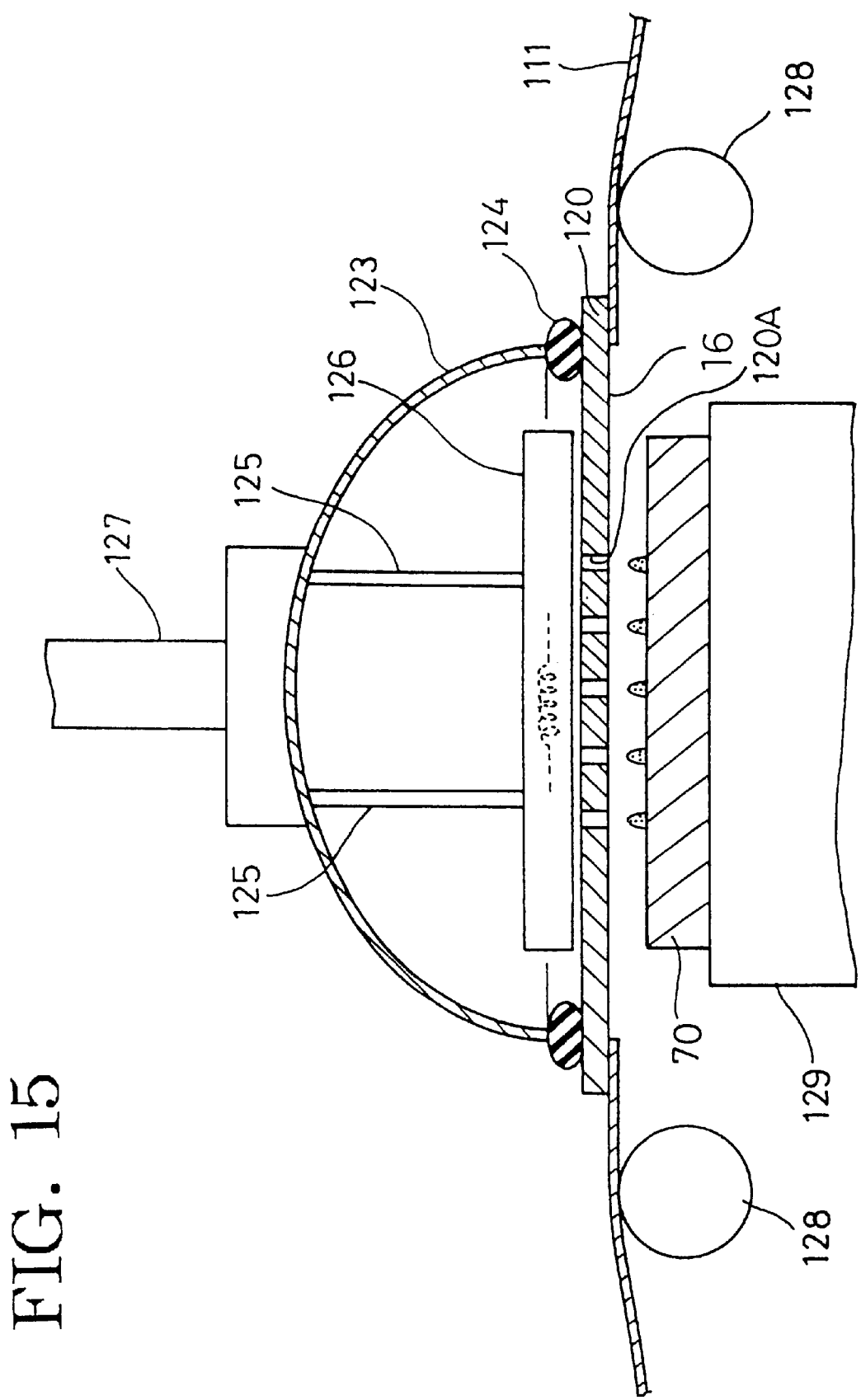
FIG. 15 is an enlarged sectional view of the solder transferring step in a state where the roller assumes an upper position.

When a predetermined time has elapsed from the start of the heating operation of the panel heater 126, the lift rollers 128 are slightly raised so that the template 120 is departed from the semiconductor package 70 as shown in FIG. 15. Consequently, the molten solder is reliably transferred onto the pads 70A. Since the solder resist layer 70B repels the molten solder or the molten solder has no wettability with respect to the solder resist layer 70B, the molten solder is rounded into the shape of a ball by the surface tension and solidified into solder balls 80 (see FIG. 9). In this case, the size of the solder balls 80 formed on the semiconductor package 70 depends on an amount of molten solder fed from the template 120. Since an amount of solder sufficient to fill up each through hole 120A is usually supplied, the diameter of each solder ball 80 can be rendered constant.

Upon transfer of the molten solder to the semiconductor package 70 side, the roller drive unit 115 is driven to move the support sheet 111 rightward as viewed in FIG. 10. The support sheet 111 is stopped when the template 120 has reached the solder filling section. The solder paste 122 is re-supplied onto the template 120. In this case, even if any amount of scrap such as flux of the solder paste 122 remains in one or more through holes 120A after the molten solder has been transferred to the package 70 side, the scrap is pushed out of the through holes 120A by the solder paste 122 forced into them from the upper side of the template 120 and finally removed by the scraping doctors 121. Thus, even when a scrap such as the flux remains in the through holes 120A as the result of repeatedly executed steps, the through holes 120A are self-cleaned and are filled with the solder paste of a high level of purity without addition of any special cleaning step. Consequently, an amount of molten solder supplied to the semiconductor package 70 can be rendered constant, and thus, a uniform size of the solder balls 80 can be obtained.

Although the panel heaters 61 and 126 disposed in the pressure housings 54 and 123 are used as the heating means in the foregoing embodiments respectively, a coil may be disposed near the template and excited by a high-frequency alternating current so that the solder is heated by electromagnetic induction. Alternatively, a high-temperature inert gas may be blown against the solder so that the latter is melted. Further, in each of the foregoing embodiments, the heater is energized to expand the inner gas in the pressure housing for the purpose of causing the pressure difference between the exterior and the interior of the pressure housing. However, a pressure gas may be supplied into the pressure housing to cause the pressure difference, instead.

The material for the templates should not be limited to ceramic such as alumina or stainless steel. The templates may be made of glass, instead. Further, the template 120 is fixed to the support sheet 111 and held in the air in the second embodiment. However, front and rear ends of the template may alternatively be placed on rails so as to be held thereon. Although the support sheet is made of stainless steel, it may alternatively be a metal sheet such as stainless steel or a plastic sheet.

Further, although the through holes are filled with the solder in a state where the template is held in the air, the template may alternatively be placed on a support base and the solder paste or molten solder may be supplied to be pushed into the through holes. In this case, the solder is pushed out between the template and the support base such that an excessive amount of solder sometimes adheres to the underside of the template. However, when the excessive solder is removed by the scraping doctor, an amount of solder filling each through hole can be rendered constant. Further, although the pressure housing is brought into contact with the template in the foregoing embodiments, it may be descended to be adjacent to the support sheet when the latter has no permeability.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention ass defined by the appended claims.

I claim:

1. A method of forming solder bumps on pads formed on a surface of a base material, the method comprising:
   supplying solder to a template having a number of through holes formed to correspond to the pads of the base material, respectively, such that the through holes are filled with the solder;
   scraping the sides of the template by doctors to remove an excessive amount of the solder;
   positioning the template in an opposing relationship relative to the base material so that the pads are aligned with the through holes, respectively;
   engaging a side of the template, disposed opposite relative to the base material, with a pressure housing so as to cover at least a portion of the template that includes the through holes; and
   suppling inert gas to an interior of the pressure housing in order to increase the pressure in the interior of the pressure housing such that a difference in pressure between an exterior and the interior of the pressure housing extrudes the solder from the template to the pad side of the base material.

2. A method as claimed in claim 1, further comprising heating the solder in the through holes of the template with a heater when the pressure housing is engaged with template, wherein the heater is disposed in the pressure housing.

3. A method as claimed in claim 1, wherein the solder supplied to the through holes of the template is molten solder, and the solder filling operation comprises:
   applying a pressure-reducing housing to the upper side of the template so that a pressure-reducing chamber is defined therein; and
   reducing the pressure in the pressure-reducing chamber in order to suck the molten solder into the through holes.

4. A method of forming solder bumps on pads formed on a surface of a base material, the method comprising:
   supplying molten solder to a template having a number of through holes formed to correspond to the pads of the base material, respectively, wherein the template has an upper side and an underside;
   applying a pressure-reducing housing to the upper side of the template so that a pressure-reducing chamber is defined in the pressure-reducing housing;
   reducing the pressure in the pressure-reducing chamber in order to suck the molten solder into the through holes of the template;
   scraping the sides of the template with doctors to remove an excessive amount of the solder;
   positioning the template in an opposing relationship relative to the base material so that the pads are aligned with the through holes, respectively;
   covering the side of the template that is opposite to the base material with a pressure housing; and
   increasing the pressure in an interior of the pressure housing such that a pressure difference between an exterior and the interior of the pressure housing acts to extrude the molten solder from the template to the pad side of the base material.

5. A method of forming solder bumps on pads formed on a surface of a base material, the method comprising:
   supplying molten solder to a template having a number of through holes formed to correspond to the pads of the base material, respectively, wherein the template has an upper side and an underside;
   applying a pressure-reducing housing to the upper side of the template so that a pressure-reducing chamber is defined in the pressure-reducing housing;
   reducing the pressure in the pressure-reducing chamber in order to suck the molten solder into the through holes of the template;
   transporting the template to a solder transfer station;
   positioning the template, at the solder transfer station, in an opposing relationship relative to the base material;
   moving a pressure housing into engagement with the template so as to cover the side of the template that is opposite to the base material; and
   supplying an inert gas to an interior of the pressure housing such that a pressure difference between an exterior and the interior of the pressure housing acts to extrude the molten solder from the template to the pad side of the base material.

* * * * *